(12) United States Patent
Chowdhury et al.

(10) Patent No.: US 9,171,758 B2
(45) Date of Patent: Oct. 27, 2015

(54) METHOD OF FORMING TRANSISTOR CONTACTS

(71) Applicant: International Business Machines Corporation, Armonk, NY (US)

(72) Inventors: Murshed Mahmud Chowdhury, Newburgh, NY (US); Woo-Hyeong Lee, Poughquag, NY (US); Aimin Xing, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 14/230,410

(22) Filed: Mar. 31, 2014

(65) Prior Publication Data

US 2015/0279734 A1 Oct. 1, 2015

(51) Int. Cl.
*H01L 21/311* (2006.01)
*H01L 21/768* (2006.01)

(52) U.S. Cl.
CPC .... *H01L 21/76879* (2013.01); *H01L 21/76802* (2013.01); *H01L 21/76814* (2013.01); *H01L 21/76831* (2013.01)

(58) Field of Classification Search
CPC ............ H01L 21/283; H01L 21/28525; H01L 21/28531; H01L 21/743; H01L 21/76804; H01L 21/311; H01L 21/76805; H01L 21/76816; H01L 21/76826; H01L 27/10888
See application file for complete search history.

(56) References Cited

U.S. PATENT DOCUMENTS

| 8,114,769 B1 * | 2/2012 | Srivastava et al. ............ 438/637 |
| 8,343,867 B2 | 1/2013 | Ng et al. |
| 8,349,678 B2 | 1/2013 | Chuang et al. |
| 8,497,169 B2 | 7/2013 | Chang et al. |
| 2005/0245073 A1 | 11/2005 | Lee et al. |
| 2009/0194503 A1 | 8/2009 | Ko et al. |
| 2013/0020630 A1 | 1/2013 | Lee et al. |
| 2013/0082332 A1 | 4/2013 | Liu et al. |
| 2013/0092957 A1 | 4/2013 | Sen et al. |
| 2013/0196496 A1 | 8/2013 | Yeh et al. |

FOREIGN PATENT DOCUMENTS

WO   WO2013095548   6/2013

* cited by examiner

*Primary Examiner* — Mohammad Choudhry
(74) *Attorney, Agent, or Firm* — Catherine Ivers; Howard M. Cohn

(57) ABSTRACT

Embodiments of the present invention provide an improved method for forming transistor contacts. A sacrificial layer is deposited in a first set of contact cavities, and a capping layer is formed on the sacrificial layer. This protects the first set of contact cavities during formation of a second set of contact cavities. The sacrificial layer is then removed, and the first and second sets of contact cavities are filled with a conductive material.

20 Claims, 11 Drawing Sheets

METHOD OF FORMING TRANSISTOR CONTACTS

FIELD OF THE INVENTION

The present invention relates generally to semiconductor fabrication, and more particularly, to methods of forming transistor contacts.

BACKGROUND OF THE INVENTION

The trend of mobile electronic devices has created a demand for increased integrated circuit performance in smaller packages. This has resulted in continuously reduced critical dimensions in integrated circuits. Various techniques such as improved lithography, multiple-patterning, and improved materials and etch techniques have enabled the reduction in size for each generation of semiconductors. However, various technical challenges still exist in semiconductor fabrication. In particular, the contacts which interface the devices to back-end-of-line (BEOL) layers are a critical part of the semiconductor process. Transistor contacts play an important role in integrated circuit fabrication. Problems with transistor contacts can affect device performance and product yield. It is therefore desirable to have improved contacts and methods of fabrication.

SUMMARY OF THE INVENTION

In a first aspect, embodiments of the present invention provide a method of forming a semiconductor structure, comprising: forming a plurality of gates and source/drain regions on a semiconductor substrate; forming an etch stop layer over the plurality of gates; forming a dielectric layer over the etch stop layer; forming a first source/drain contact cavity in the dielectric layer; depositing a first sacrificial fill layer in the first source/drain contact cavity; forming a second source/drain contact cavity in the dielectric layer; removing the first sacrificial fill layer in the first source/drain contact cavity; depositing a second sacrificial fill layer in the first source/drain contact cavity and second source/drain contact cavity; partially recessing the second sacrificial fill layer to a level below a top of the dielectric layer; depositing a capping layer over the dielectric layer and second sacrificial fill layer; forming a plurality of gate contact cavities, wherein each of the plurality of gate contact cavities exposes one of the plurality of gates; removing the second sacrificial fill layer; and depositing a fill metal in the first source/drain contact cavity, second source/drain contact cavity, and the plurality of gate contact cavities.

In a second aspect, embodiments of the present invention provide a method of forming a semiconductor structure, comprising: forming a plurality of gates and source/drain regions on a semiconductor substrate; forming an etch stop layer over the plurality of gates; forming a dielectric layer over the etch stop layer; forming a first source/drain contact cavity in the dielectric layer; depositing a first sacrificial fill layer in the first source/drain contact cavity; forming a second source/drain contact cavity in the dielectric layer; removing the first sacrificial fill layer in the first source/drain contact cavity; depositing a second sacrificial fill layer in the first source/drain contact cavity and second source/drain contact cavity; partially recessing the second sacrificial fill layer to a level below a top of the dielectric layer; depositing a capping layer over the dielectric layer and second sacrificial fill layer; forming a plurality of gate contact cavities, wherein each of the plurality of gate contact cavities exposes one of the plurality of gates; removing the second sacrificial fill layer; and depositing a fill metal in the first source/drain contact cavity, second source/drain contact cavity, and the plurality of gate contact cavities; wherein depositing a first sacrificial fill layer and depositing a second sacrificial fill layer comprise depositing a material selected from the group consisting of: polyacrylate resin, epoxy resin, phenol resin, polyamide resin, polyimide resin, unsaturated polyester resin, polyphenylenether resin, polyphenylenesulfide resin, and benzocyclobutene (BCB).

In a third aspect, embodiments of the present invention provide a method of forming a semiconductor structure, comprising: forming a plurality of gates and source/drain regions on a semiconductor substrate; forming an etch stop layer over the plurality of gates; forming a dielectric layer over the etch stop layer; forming a first source/drain contact cavity in the dielectric layer; depositing a first sacrificial fill layer in the first source/drain contact cavity; forming a second source/drain contact cavity in the dielectric layer; removing the first sacrificial fill layer in the first source/drain contact cavity; depositing a second sacrificial fill layer in the first source/drain contact cavity and second source/drain contact cavity; partially recessing the second sacrificial fill layer to a level below a top of the dielectric layer; depositing a capping layer over the dielectric layer and second sacrificial fill layer, wherein the capping layer has a thickness over the dielectric layer ranging from about 20 nanometers to about 40 nanometers; forming a plurality of gate contact cavities, wherein each of the plurality of gate contact cavities exposes one of the plurality of gates; removing the second sacrificial fill layer; and depositing a fill metal in the first source/drain contact cavity, second source/drain contact cavity, and the plurality of gate contact cavities.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
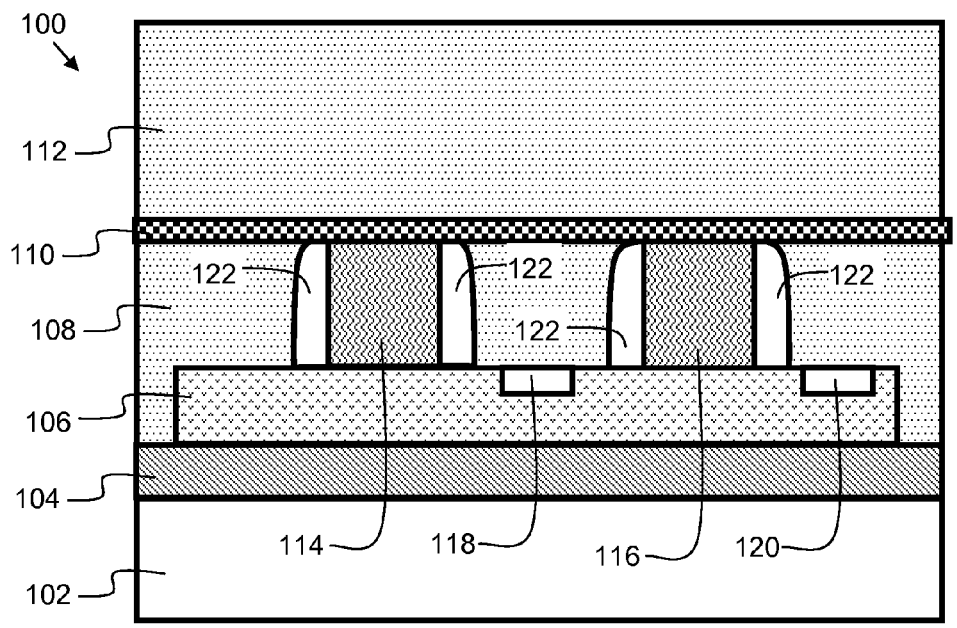

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 shows a semiconductor structure at a starting point for embodiments of the present invention.

Figure 2:
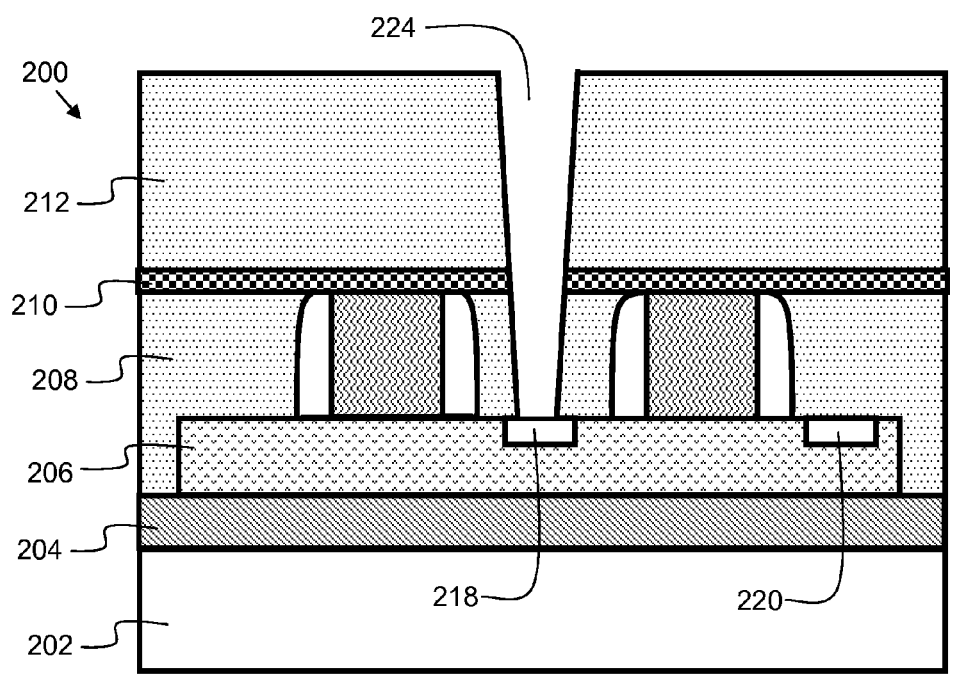

FIG. 2 shows a semiconductor structure after a subsequent process step of forming a first source/drain contact.

Figure 3:
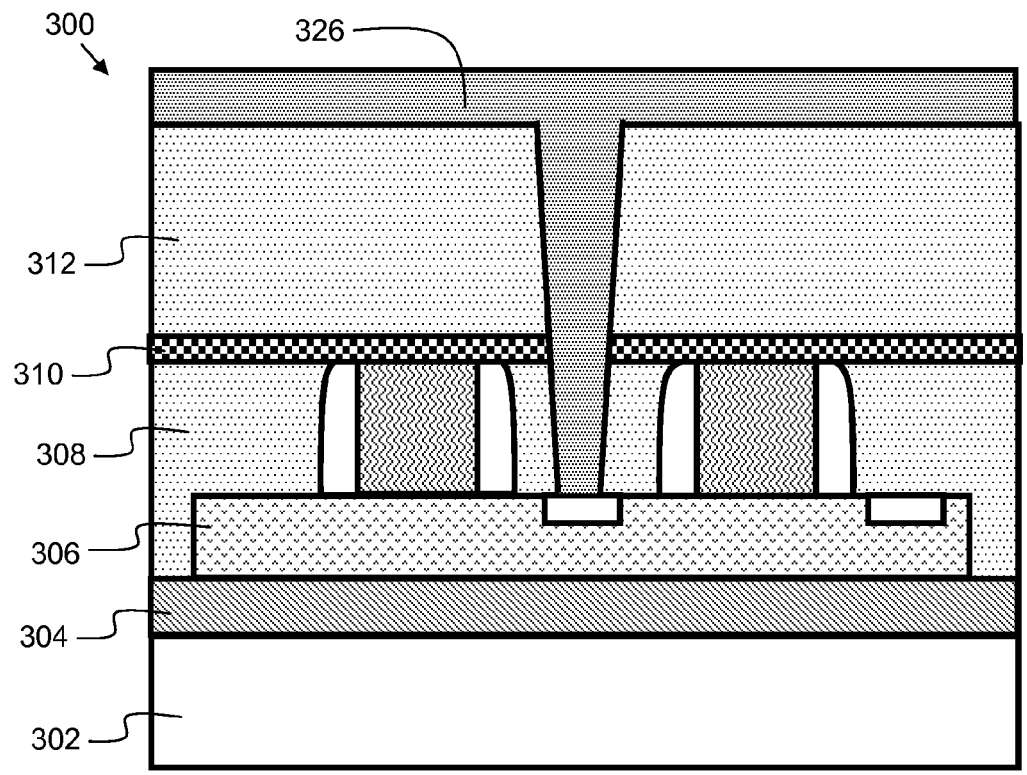

FIG. 3 shows a semiconductor structure after a subsequent process step of depositing a first sacrificial fill layer.

Figure 4:
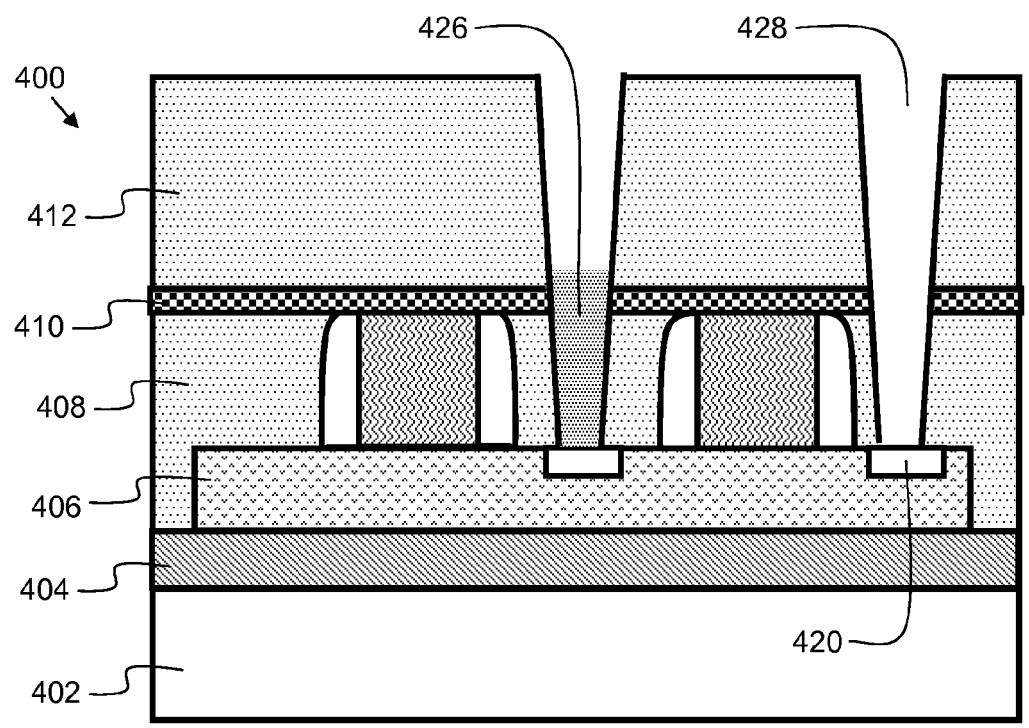

FIG. 4 shows a semiconductor structure after a subsequent process step of forming a second source/drain contact.

Figure 5:
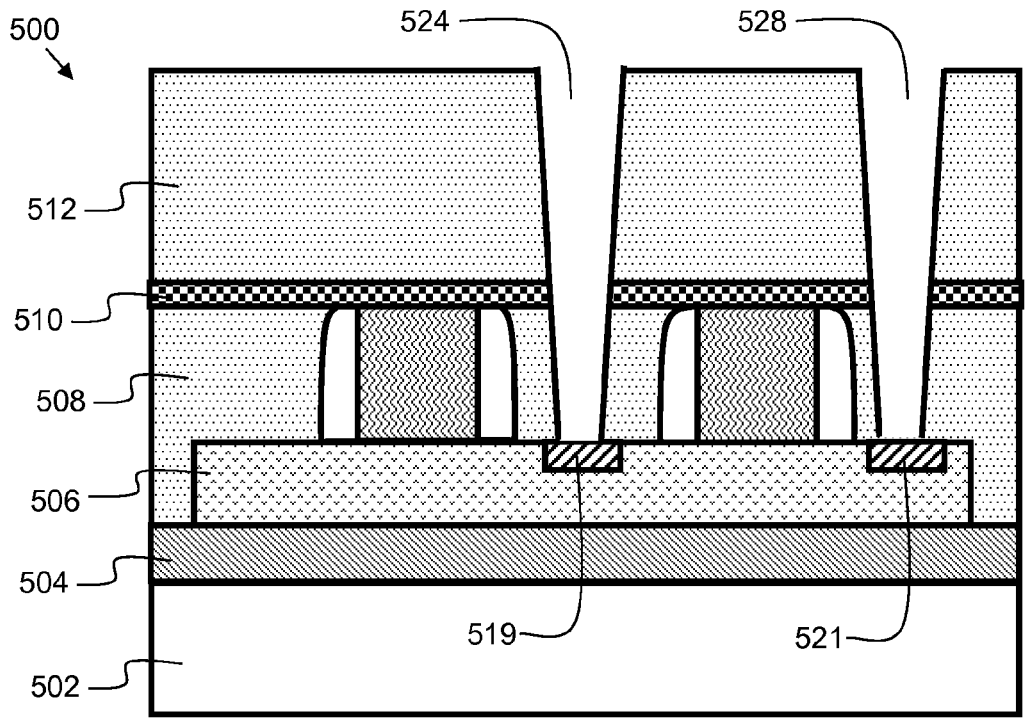

FIG. 5 shows a semiconductor structure after a subsequent process step of removing the first sacrificial fill layer.

Figure 6:
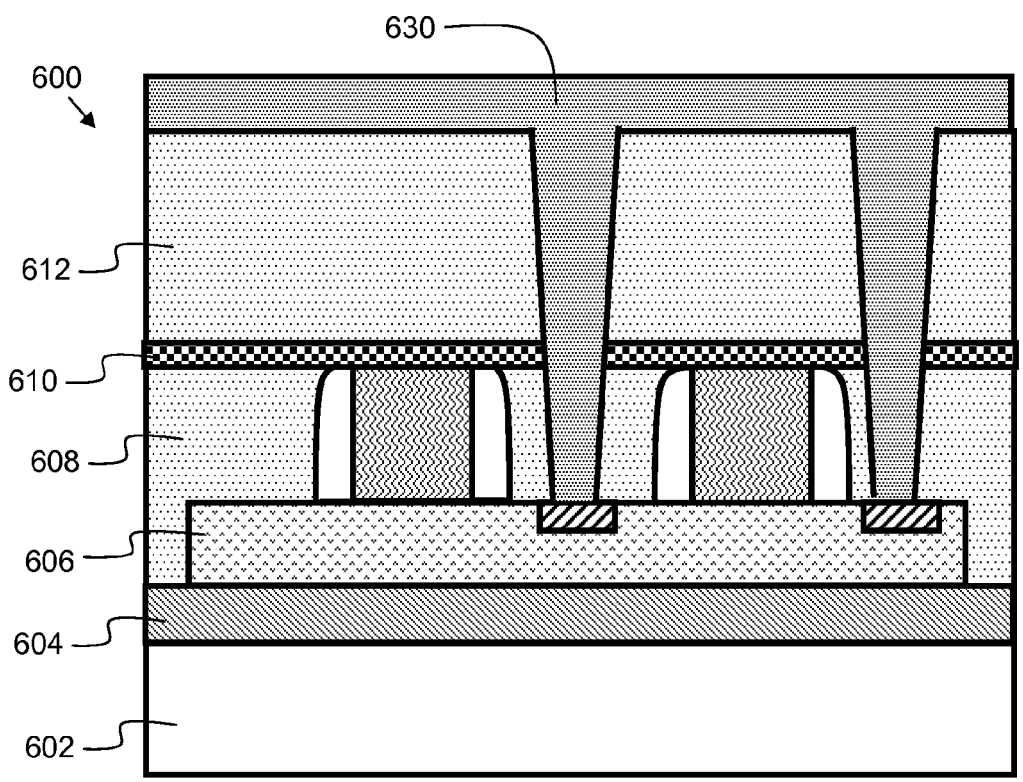

FIG. 6 shows a semiconductor structure after a subsequent process step of depositing a second sacrificial fill layer.

Figure 7:
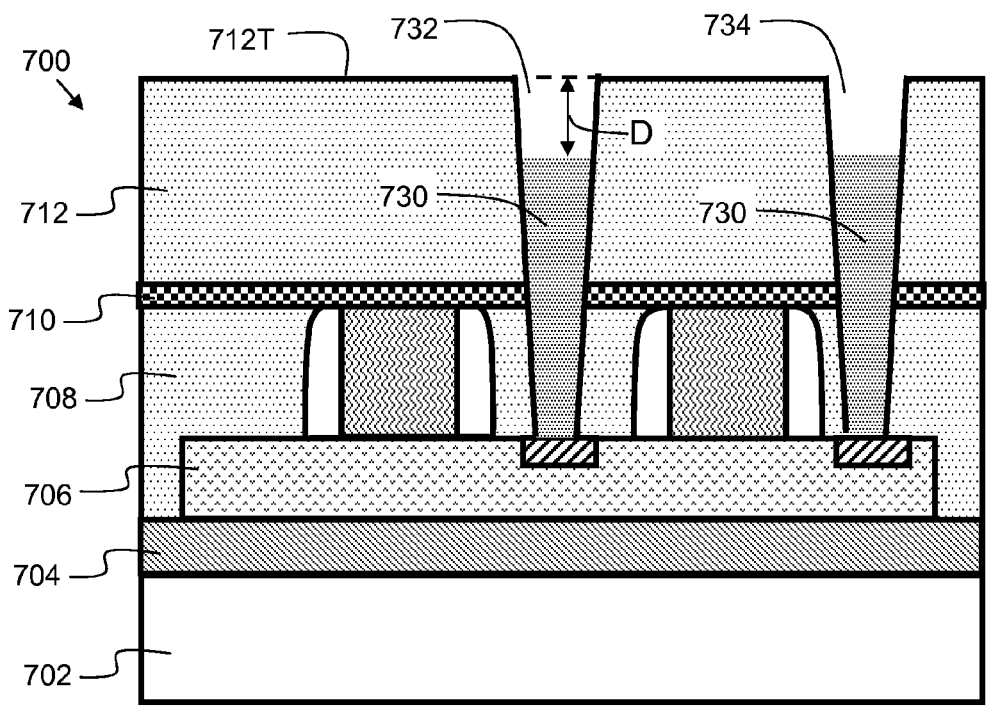

FIG. 7 shows a semiconductor structure after a subsequent process step of performing a partial recess of the second sacrificial fill layer.

Figure 8:
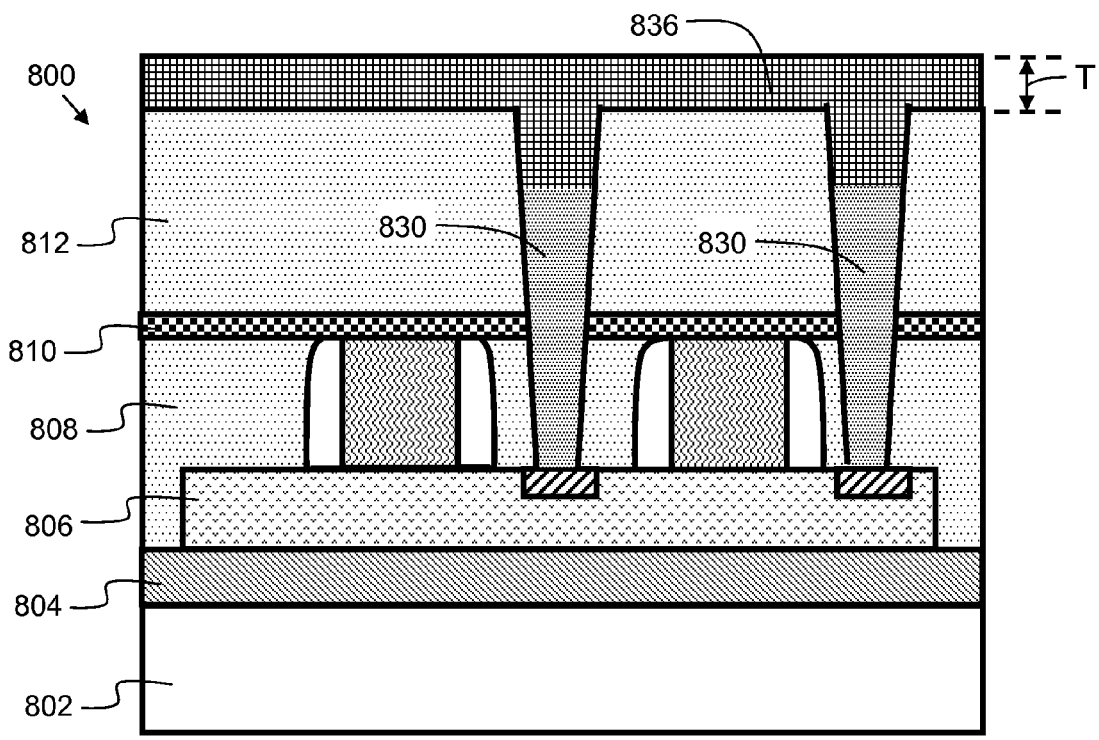

FIG. 8 shows a semiconductor structure after a subsequent process step of depositing a capping layer.

Figure 9:
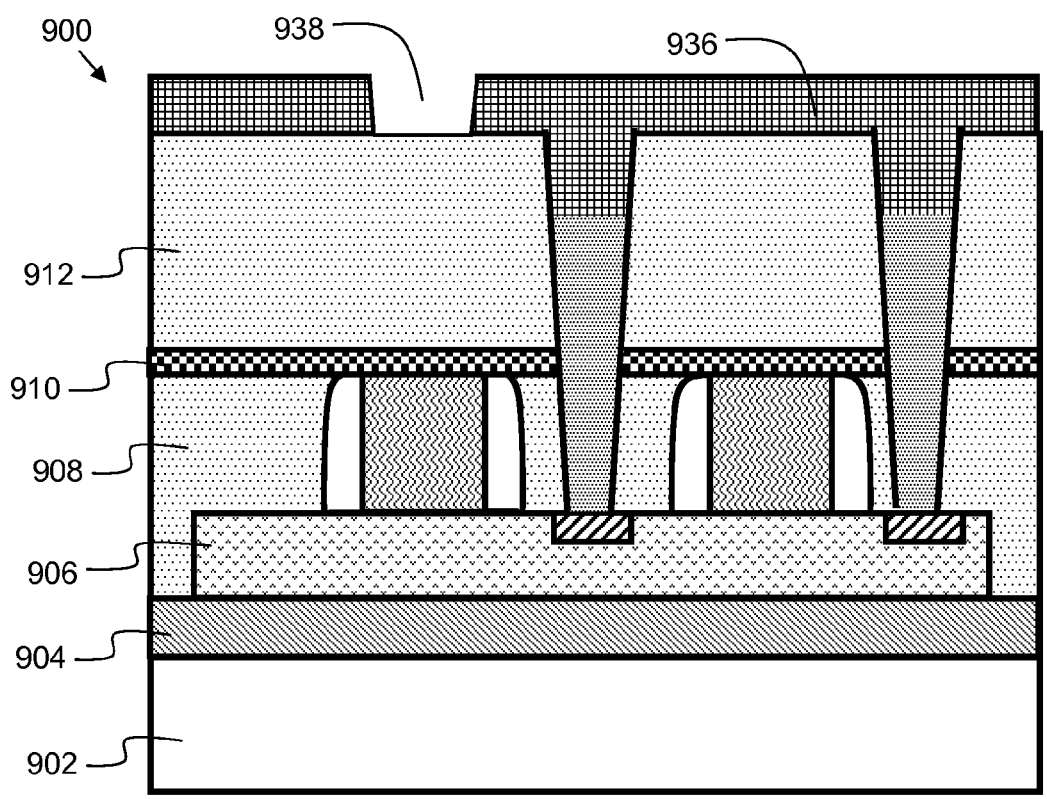

FIG. 9 shows a semiconductor structure after a subsequent process step of forming a first opening in the capping layer.

Figure 10:
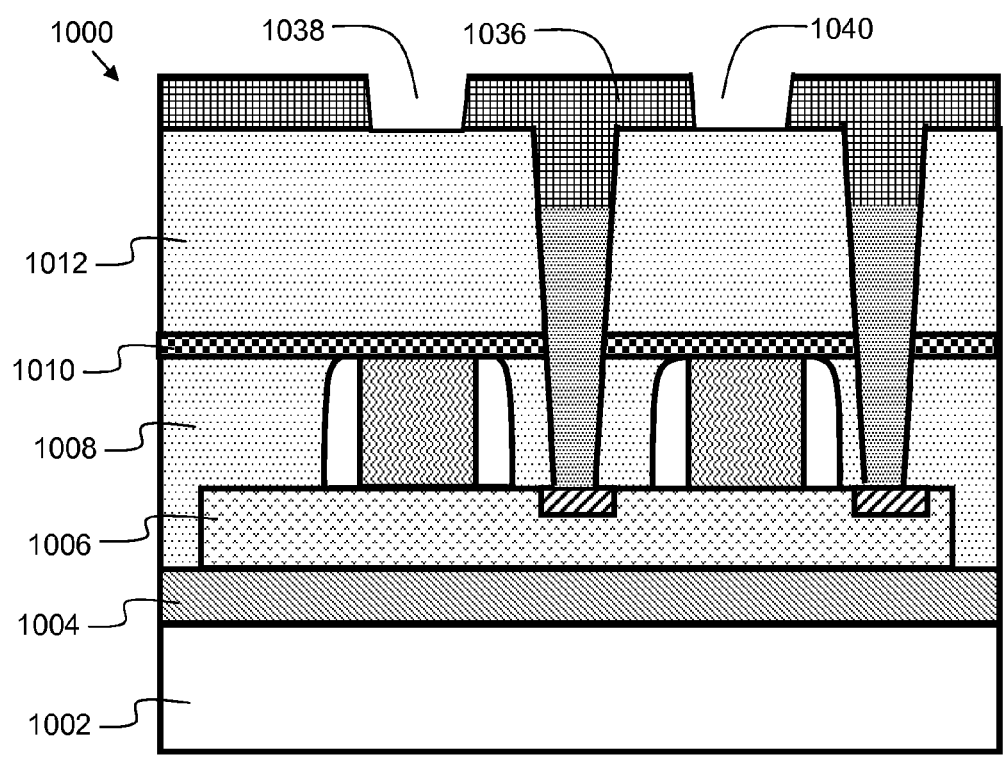

FIG. 10 shows a semiconductor structure after a subsequent process step of forming a second opening in the capping layer.

Figure 11:
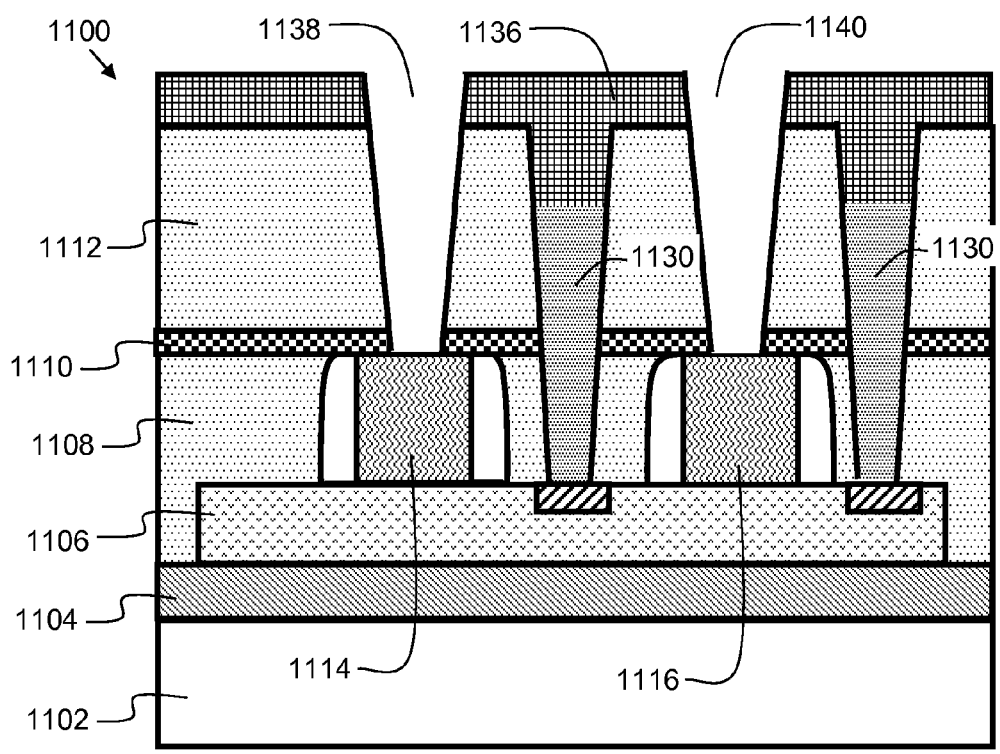

FIG. 11 shows a semiconductor structure after a subsequent process step of forming gate contact cavities.

Figure 12:
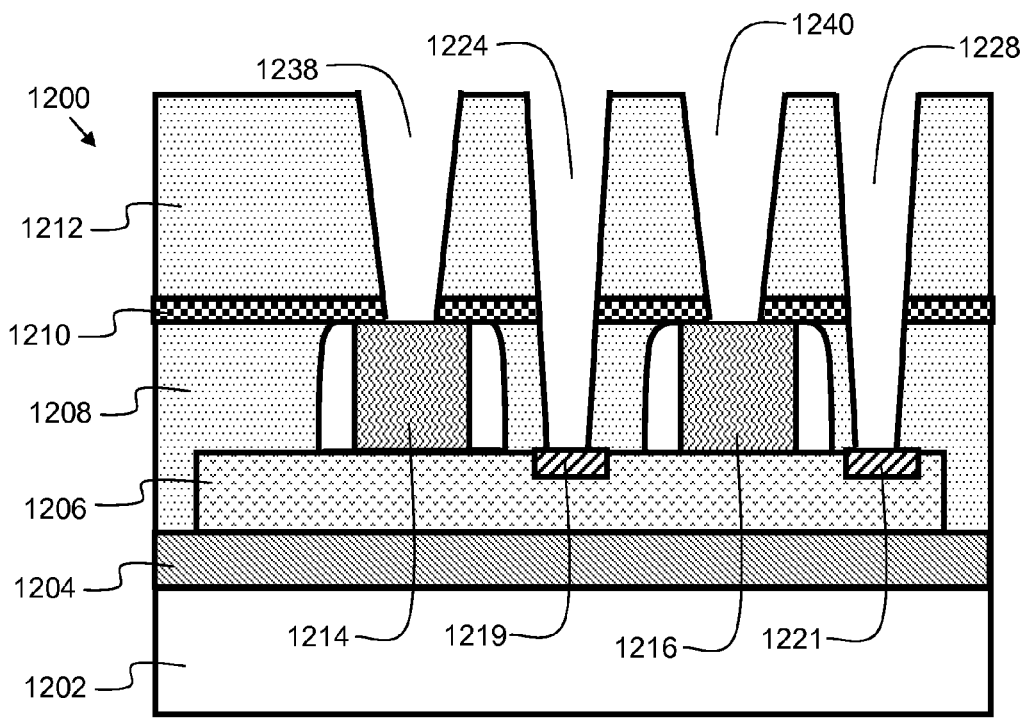

FIG. 12 shows a semiconductor structure after a subsequent process step of removing the second sacrificial fill layer and capping layer.

Figure 13A:
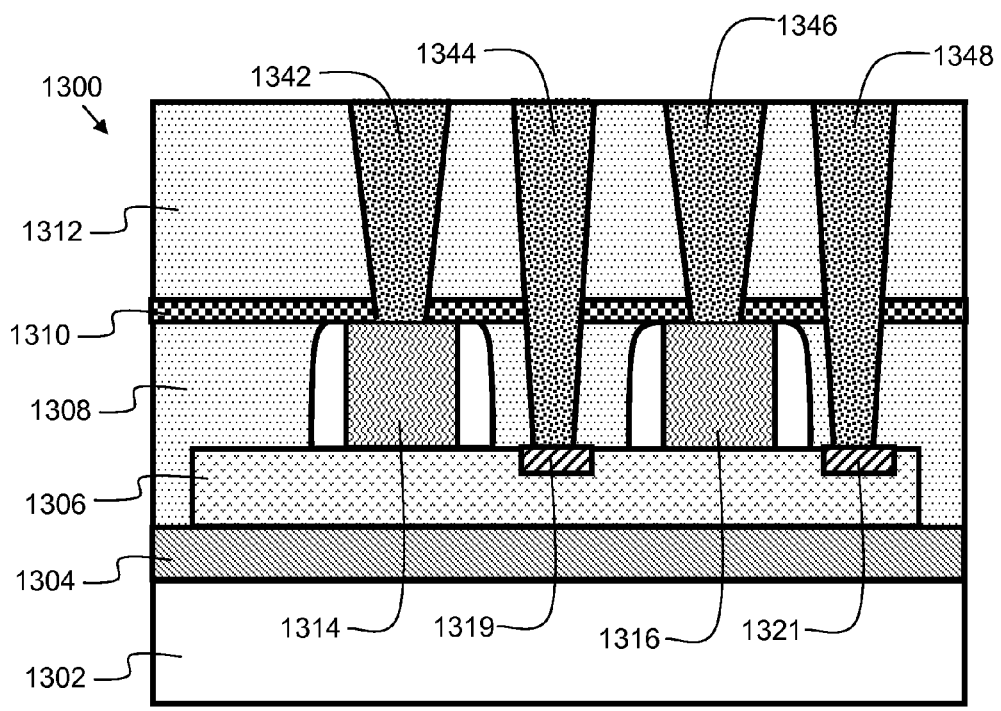

FIG. 13A shows a semiconductor structure after a subsequent process step of depositing a metal in the contact cavities.

Figure 13B:
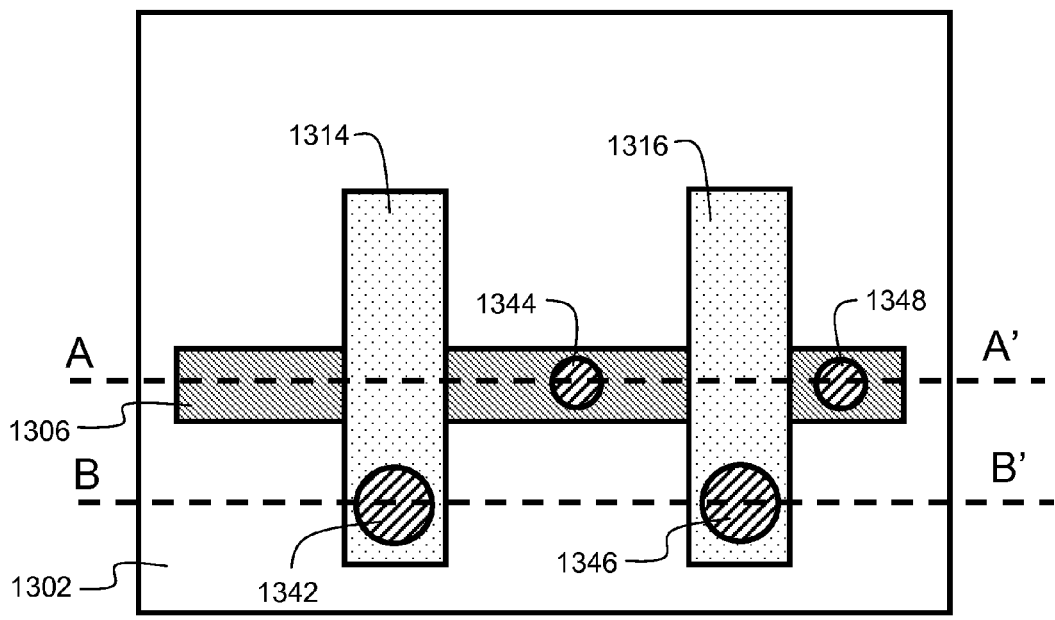

FIG. 13B shows a top-down view of a semiconductor structure in accordance with embodiments of the present invention.

Figure 14:
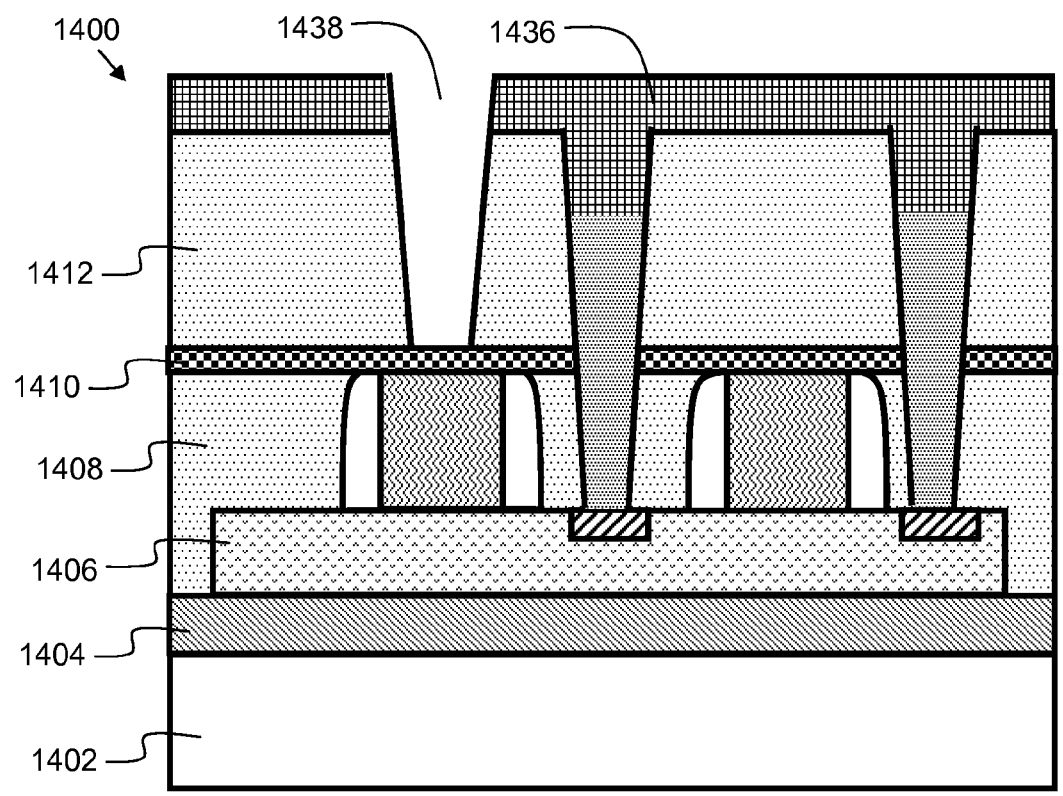

FIG. 14 shows a semiconductor structure after a subsequent process step of forming a first opening in the dielectric layer in accordance with an alternative embodiment.

Figure 15:
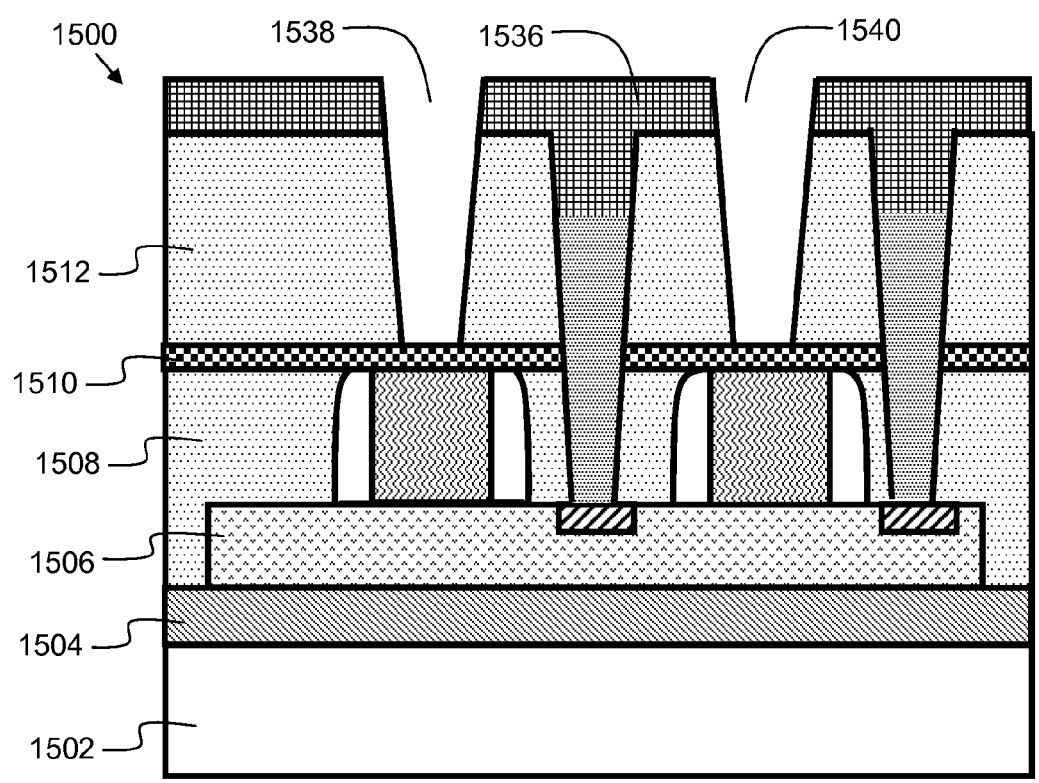

FIG. 15 shows a semiconductor structure after a subsequent process step of forming a second opening in the dielectric layer in accordance with an alternative embodiment.

Figure 16:
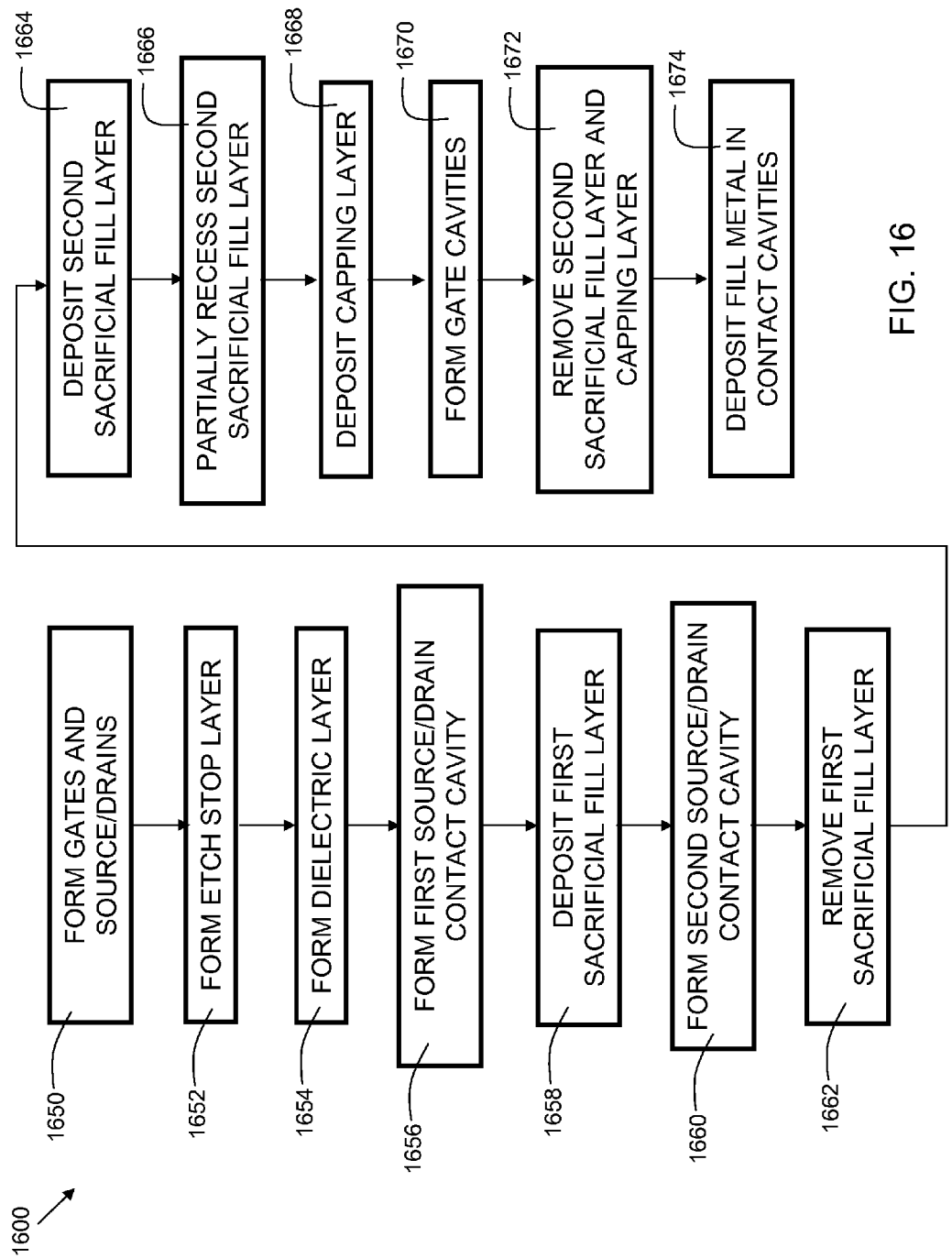

FIG. 16 is a flowchart indicating process steps for embodiments of the present invention.

DETAILED DESCRIPTION

Embodiments of the present invention provide an improved method for forming transistor contacts. A sacrificial layer is deposited in a first set of contact cavities, and a capping layer is formed on the sacrificial layer. This protects the first set of contact cavities during formation of a second set of contact cavities. The sacrificial layer is then removed, and the first and second sets of contact cavities are filled with a conductive material.

FIG. 1 shows a semiconductor structure 100 at a starting point for embodiments of the present invention. Semiconductor structure 100 comprises semiconductor substrate 102, which may comprise a bulk silicon substrate, such as a silicon wafer. A buried insulator (BOX) layer 104 is disposed on the semiconductor substrate 102. A semiconductor-on-insulator (SOI) substrate 106 is disposed on the BOX layer 104. In embodiments, the SOI substrate 106 may be comprised of silicon, silicon germanium, or other suitable material or combination of materials. SOI substrate 106 may be formed into a fin as part of a fin type field effect transistor (finFET). A first transistor gate 114 and a second transistor gate 116 are formed on the SOI substrate 106. In embodiments, the first transistor gate 114 and second transistor gate 116 may be comprised of polysilicon. In other embodiments, the first transistor gate 114 and second transistor gate 116 may be comprised of metal, and may be formed using a replacement metal gate (RMG) process. Disposed adjacent to the first transistor gate 114 and second transistor gate 116 are spacers 122. In embodiments, spacers 122 are comprised of silicon nitride, or other suitable material. Source/drain regions 118 and 120 may comprise doped regions of SOI substrate 106, and may further include silicide regions and/or stressor regions (not shown). A dielectric layer 108 is formed on the structure, and is disposed in between the two transistor gates. In embodiments, the dielectric layer 108 may be comprised of silicon oxide. An etch stop layer 110 is formed on the transistor gates 114 and 116. In embodiments, the etch stop layer 110 is comprised of silicon nitride. A dielectric layer 112 is formed above the etch stop layer 110. In embodiments, dielectric layer 108 and dielectric layer 112 are comprised of the same material. In other embodiments, dielectric layer 108 and dielectric layer 112 are comprised of different materials. Note that while FIG. 1 shows a SOI structure, embodiments of the present invention may also be used in bulk devices, where no BOX layer is present.

FIG. 2 shows a semiconductor structure 200 after a subsequent process step of forming a first source/drain contact. As stated previously, often, similar elements may be referred to by similar numbers in various figures (FIGs) of the drawing, in which case typically the last two significant digits may be the same, the most significant digit being the number of the drawing figure (FIG). Hence, the semiconductor substrate 202 of FIG. 2 is similar to the semiconductor substrate 102 of FIG. 1. A first source/drain contact cavity 224 is formed in the dielectric layer 212. The contact cavity 224 may be formed by patterning a mask (not shown) on the dielectric layer 212, followed by performing an anisotropic etch to form the contact cavity 224. In embodiments, the anisotropic etch is a reactive ion etch (RIE). Contact cavity 224 exposes (opens) source/drain region 218. Source/drain region 220 is not yet opened. As critical dimensions decrease, multiple patterning techniques, such as double or triple patterning, are used to form contact cavities at multiple steps. A problem with prior art processes is that the contacts formed early in the fabrication process may not be adequately protected when subsequent contact cavities are formed, and thus, can be prone to damage that may affect device performance and product yield. Embodiments of the present invention provide protection for the contact cavities that are formed early, so that they are not damaged during formation of subsequent contact cavities.

FIG. 3 shows a semiconductor structure 300 after a subsequent process step of depositing a first sacrificial fill layer 326. The sacrificial fill layer 326 may be comprised of an organic dielectric layer, which can include a photo-sensitive organic polymer or an etch type organic compound. For instance, the photo-sensitive organic polymer may include, but is not limited to, epoxy resin, phenol resin, polyacrylate resin, polyamide resin, polyimide resin, polyphenylenether resin, unsaturated polyester resin, polyphenylenesulfide resin, or benzocyclobutene (BCB). These materials may be formed using spin-on techniques. In other embodiments, the sacrificial fill layer 326 may be comprised of amorphous carbon. The sacrificial fill layer 326 protects the first source/drain contact cavity during subsequent process steps.

FIG. 4 shows a semiconductor structure 400 after a subsequent process step of forming a second source/drain contact 428. The formation of the second source drain contact 428 may involve an anisotropic etch process similar to what is used to form the first source/drain contact. The anisotropic etch process causes damage to the first sacrificial fill layer 426, such that it is reduced from its previous size (see 326 of FIG. 3), but is not completely removed.

FIG. 5 shows a semiconductor structure 500 after a subsequent process step of removing the first sacrificial fill layer (compare with 426 of FIG. 4). The first sacrificial fill layer may be removed using a selective removal process. In embodiments, the removal of the first sacrificial fill layer is performed using an oxygen plasma ash process. As a result of the process thus far, source/drain contact cavities 524 and 528 are formed. Silicide regions 519 and 521 may then optionally be formed using industry-standard techniques. The silicide regions may serve to lower contact resistance, resulting in improved device performance.

FIG. 6 shows a semiconductor structure 600 after a subsequent process step of depositing a second sacrificial fill layer 630. In embodiments, the second sacrificial fill layer 630 may be comprised of a material similar to that of first sacrificial fill layer 326 (see FIG. 3). The second sacrificial fill layer 630 is deposited in the source/drain contact cavities (see 524 and 528 of FIG. 5).

FIG. 7 shows a semiconductor structure 700 after a subsequent process step of performing a partial recess of the second sacrificial fill layer. In embodiments, the recess may be performed with a selective etch process, such as a wet etch process, or oxygen plasma ashing process. The second sacrificial fill layer 730 is recessed to a depth D. In embodiments, the depth D ranges from about 10 nanometers to about 30 nanometers. The depth D is as measured from the top 712T of the dielectric layer 712 to the top of the partially recessed second sacrificial fill layer 730. Hence, the second sacrificial fill layer 730 is recessed to a level below the top 712T of the dielectric layer 712.

FIG. 8 shows a semiconductor structure 800 after a subsequent process step of depositing a capping layer 836. In embodiments, the capping layer 836 may be comprised of a material including, but not limited to, TiARC (titanium anti-reflective coating), silicon nitride (Si3N4), hafnium oxide (HfO2), and titanium nitride (TiN). The capping layer 836 has a thickness T relative to the top of the dielectric layer 812. In embodiments, T ranges from about 20 nanometers to about 40 nanometers. The capping layer 836 serves to provide additional protection for the source/drain contact cavities during formation of gate contact cavities.

FIG. 9 shows a semiconductor structure 900 after a subsequent process step of forming a first opening 938 in the capping layer 936. In embodiments, opening 938 may be formed by depositing a patterned mask (not shown) over the capping layer 936, followed by an anisotropic etch process. The first opening 938 extends to, and exposes the dielectric layer 912.

FIG. 10 shows a semiconductor structure 1000 after a subsequent process step of forming a second opening 1040 in the capping layer. In embodiments, opening 1040 may be formed by depositing a patterned mask (not shown) over the capping layer 1036, followed by an anisotropic etch process. The second opening 1040 extends to, and exposes the dielectric layer 1012.

FIG. 11 shows a semiconductor structure 1100 after a subsequent process step of forming gate contact cavities 1138 and 1140. The gate contact cavities 1138 and 1140 may be formed simultaneously, and may be formed using an anisotropic etch process, such as a reactive ion etch process. In embodiments, a single etch process may be used to etch through both the dielectric layer 1112 and the etch stop layer 1110. In other embodiments, a separate etch process may be used for etching the dielectric layer 1112 and the etch stop layer 1110. As a result of the process steps thus far, the gate contact cavities 1138 and 1140 are formed to expose (open) gates 1114 and 1116, respectively, while the source/drain contact cavities are still filled with the second sacrificial fill layer 1130.

FIG. 12 shows a semiconductor structure 1200 after a subsequent process step of removing the second sacrificial fill layer and capping layer. As a result, the source/drain contact cavities 1224 and 1228 are empty, exposing silicided source/drain regions 1219 and 1221, respectively. Furthermore, the gate contact cavities 1238 and 1240 are empty, exposing gates 1214 and 1216, respectively. Since the source/drain contact cavities 1224 and 1228 were filled with a sacrificial fill layer during the formation of the gate contact cavities 1238 and 1240, the source/drain contact cavities 1224 and 1228 were protected from damage during the process of forming the gate contact cavities.

FIG. 13A shows a semiconductor structure 1300 after a subsequent process step of depositing a metal in the contact cavities. As a result of the metal deposition, gate contacts 1342 and 1346 are formed, along with source/drain contact 1344 and source/drain contact 1348. In embodiments, the source/drain contact 1344 and source/drain contact 1348 are in direct physical contact with silicided source/drain regions 1319 and 1321, respectively. In embodiments, the material for the contacts may include, but is not limited to, tungsten, cobalt, copper, aluminum, and titanium, or alloys thereof. Other contact materials are possible. After deposition of the metal, a planarization process, such as a chemical mechanical polish (CMP) process may be used to remove excess metal.

FIG. 13B shows a top-down view of semiconductor structure 1300 in accordance with embodiments of the present invention. As can be seen in this view, the SOI substrate 1306 has the source/drain contacts 1344 and 1348 formed thereon along line A-A', and the gate contacts 1342 and 1346 are formed on gates 1314 and 1316, respectively, along line B-B'. Hence, in embodiments, the source/drain contacts and gate contacts are not necessarily all in line with each other.

FIG. 14 shows a semiconductor structure 1400 after a subsequent process step of forming a first opening in the dielectric layer in accordance with an alternative embodiment. In this alternative embodiment, following from the structure 800 of FIG. 8, a gate contact cavity 1438 is formed through both capping layer 1436 and dielectric layer 1412, and stopping on etch stop layer 1410. Hence, the gate contact cavity 1438 extends to, and exposes the etch stop layer 1410.

FIG. 15 shows a semiconductor structure 1500 after a subsequent process step of forming a second opening in the dielectric layer in accordance with an alternative embodiment. In this alternative embodiment, following from the structure 1400 of FIG. 14, a second gate contact cavity 1540 is formed through both capping layer 1536 and dielectric layer 1512, and stopping on etch stop layer 1510. Hence, the gate contact cavity 1540 extends to, and exposes the etch stop layer 1510. From this point forward, the fabrication process proceeds to FIG. 11, where an etch process simultaneously opens both gates by etching through the etch stop layer 1110 to expose the gates. The process continues to FIG. 12 where the second sacrificial fill layer is removed, and then to filling of the contact cavities as shown in FIG. 13A.

FIG. 16 is a flowchart 1600 indicating process steps for embodiments of the present invention. In process step 1650, gates and source/drain regions are formed on a semiconductor substrate. In process step 1652, an etch stop layer is formed on the gates. In process step 1654, a dielectric layer, such as silicon oxide, is formed on the etch stop layer. In embodiments, the dielectric layer is deposited using a chemical vapor deposition (CVD) process. In process step 1656, a first source/drain contact cavity is formed (see 224 of FIG. 2). In process step 1658, a first sacrificial fill layer is deposited (see 326 of FIG. 3). In process step 1660, a second source/drain contact cavity is formed (see 428 of FIG. 4). In process step 1662, the first sacrificial fill layer is removed (see 500 of FIG. 5). In process step 1664, a second sacrificial fill layer is deposited (see 630 of FIG. 6). In process step 1666, the second sacrificial fill layer is partially recessed (see 730 of FIG. 7). In process step 1668, a capping layer is deposited (see 836 of FIG. 8). In process step 1670, gate cavities are formed. In embodiments, these may be formed by individually opening the capping layer for each gate, and then simultaneously etching the dielectric and etch stop layer for both gate cavities, as shown in FIGS. 9, 10, and 11. Alternatively, the gate contact cavities may be formed by individually forming a contact cavity through the dielectric layer, stopping on the etch stop layer, and then simultaneously etching the etch stop layers for both gate cavities, as shown in FIGS. 14 and 15. Regardless of which embodiment is used for forming the gate cavities, the process continues to process step 1672, in which the second sacrificial fill layer and capping layer are removed (see 1200 of FIG. 12). In process step 1674, a fill metal is deposited in the contact cavities (see 1300 of FIG. 13A). In embodiments, the fill metal is deposited using chemical vapor deposition, physical vapor deposition, or atomic layer deposition. From this point forward, industry-standard techniques may be used to complete the fabrication of the integrated circuit (IC).

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a semiconductor structure, comprising:
    forming a plurality of gates and source/drain regions on a semiconductor substrate;
    forming an etch stop layer over the plurality of gates;
    forming a dielectric layer over the etch stop layer;
    forming a first source/drain contact cavity in the dielectric layer;
    depositing a first sacrificial fill layer in the first source/drain contact cavity;
    forming a second source/drain contact cavity in the dielectric layer;
    removing the first sacrificial fill layer in the first source/drain contact cavity;
    depositing a second sacrificial fill layer in the first source/drain contact cavity and second source/drain contact cavity;
    partially recessing the second sacrificial fill layer to a level below a top of the dielectric layer;
    depositing a capping layer over the dielectric layer and second sacrificial fill layer;
    forming a plurality of gate contact cavities, wherein each of the plurality of gate contact cavities exposes one of the plurality of gates;
    removing the second sacrificial fill layer; and
    depositing a fill metal in the first source/drain contact cavity, second source/drain contact cavity, and the plurality of gate contact cavities.

2. The method of claim 1, wherein depositing a first sacrificial fill layer and second sacrificial fill layer comprises depositing an organic dielectric layer.

3. The method of claim 2, wherein depositing an organic dielectric layer comprises depositing a photo-sensitive organic polymer.

4. The method of claim 1, wherein depositing a capping layer comprises depositing silicon nitride.

5. The method of claim 1, wherein depositing a capping layer comprises depositing hafnium oxide.

6. The method of claim 1, wherein depositing a capping layer comprises depositing titanium nitride.

7. The method of claim 1, wherein removing the second sacrificial fill layer is performed using an oxygen plasma ash process.

8. The method of claim 1, wherein forming a plurality of gate contact cavities comprises:
    forming a first opening in the capping layer, wherein the first opening extends to, and exposes the dielectric layer;
    forming a second opening in the capping layer, wherein the second opening extends to, and exposes the dielectric layer; and
    performing an anisotropic etch to simultaneously extend the first opening to a first gate of the plurality of gates, and extending the second opening to a second gate of the plurality of gates.

9. The method of claim 8, wherein performing an anisotropic etch comprises performing a reactive ion etch.

10. The method of claim 1, wherein forming a plurality of gate contact cavities comprises:
    forming a first opening in the capping layer, wherein the first opening extends to, and exposes the etch stop layer;
    forming a second opening in the capping layer, wherein the second opening extends to, and exposes the etch stop layer; and
    performing an anisotropic etch to simultaneously extend the first opening to a first gate of the plurality of gates, and extending the second opening to a second gate of the plurality of gates.

11. The method of claim 10, wherein performing an anisotropic etch comprises performing a reactive ion etch.

12. The method of claim 1, wherein a second sacrificial fill layer comprises depositing amorphous carbon.

13. A method of forming a semiconductor structure, comprising:
    forming a plurality of gates and source/drain regions on a semiconductor substrate;
    forming an etch stop layer over the plurality of gates;
    forming a dielectric layer over the etch stop layer;
    forming a first source/drain contact cavity in the dielectric layer;
    depositing a first sacrificial fill layer in the first source/drain contact cavity;
    forming a second source/drain contact cavity in the dielectric layer;
    removing the first sacrificial fill layer in the first source/drain contact cavity;
    depositing a second sacrificial fill layer in the first source/drain contact cavity and second source/drain contact cavity;
    partially recessing the second sacrificial fill layer to a level below a top of the dielectric layer;
    depositing a capping layer over the dielectric layer and second sacrificial fill layer;
    forming a plurality of gate contact cavities, wherein each of the plurality of gate contact cavities exposes one of the plurality of gates;
    removing the second sacrificial fill layer; and
depositing a fill metal in the first source/drain contact cavity, second source/drain contact cavity, and the plurality of gate contact cavities; wherein depositing a first sacrificial fill layer and depositing a second sacrificial fill layer comprise depositing a material selected from the group consisting of: polyacrylate resin, epoxy resin, phenol resin, polyamide resin, polyimide resin, unsaturated polyester resin, polyphenylenether resin, polyphenylenesulfide resin, and benzocyclobutene (BCB).

14. The method of claim 13, wherein forming a plurality of gate contact cavities comprises:
- forming a first opening in the capping layer, wherein the first opening extends to, and exposes the dielectric layer;
- forming a second opening in the capping layer, wherein the second opening extends to, and exposes the dielectric layer; and
- performing an anisotropic etch to simultaneously extend the first opening to a first gate of the plurality of gates, and extending the second opening to a second gate of the plurality of gates.

15. The method of claim 13, wherein forming a plurality of gate contact cavities comprises:
- forming a first opening in the capping layer, wherein the first opening extends to, and exposes the etch stop layer;
- forming a second opening in the capping layer, wherein the second opening extends to, and exposes the etch stop layer; and
- performing an anisotropic etch to simultaneously extend the first opening to a first gate of the plurality of gates, and extending the second opening to a second gate of the plurality of gates.

16. The method of claim 13, wherein depositing a capping layer comprises depositing silicon nitride.

17. The method of claim 13, wherein depositing a capping layer comprises depositing hafnium oxide.

18. The method of claim 13, wherein depositing a capping layer comprises depositing titanium nitride.

19. A method of forming a semiconductor structure, comprising:
- forming a plurality of gates and source/drain regions on a semiconductor substrate;
- forming an etch stop layer over the plurality of gates;
- forming a dielectric layer over the etch stop layer;
- forming a first source/drain contact cavity in the dielectric layer;
- depositing a first sacrificial fill layer in the first source/drain contact cavity;
- forming a second source/drain contact cavity in the dielectric layer;
- removing the first sacrificial fill layer in the first source/drain contact cavity;
- depositing a second sacrificial fill layer in the first source/drain contact cavity and second source/drain contact cavity;
- partially recessing the second sacrificial fill layer to a level below a top of the dielectric layer;
- depositing a capping layer over the dielectric layer and second sacrificial fill layer, wherein the capping layer has a thickness over the dielectric layer ranging from about 20 nanometers to about 40 nanometers;
- forming a plurality of gate contact cavities, wherein each of the plurality of gate contact cavities exposes one of the plurality of gates;
- removing the second sacrificial fill layer; and
- depositing a fill metal in the first source/drain contact cavity, second source/drain contact cavity, and the plurality of gate contact cavities.

20. The method of claim 19, wherein partially recessing the second sacrificial fill layer to a level below the top of the dielectric layer comprises recessing the second sacrificial fill layer to a depth ranging from about 10 nanometers to about 30 nanometers.

* * * * *